US009830272B2

(12) United States Patent
Sorani et al.

(10) Patent No.: US 9,830,272 B2
(45) Date of Patent: Nov. 28, 2017

(54) CACHE MEMORY STAGED REOPEN

(75) Inventors: Iris Sorani, Nahariya (IL); Larisa Novakovsky, Haifa (IL); Joseph Nuzman, Haifa (IL)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 13/994,639

(22) PCT Filed: Dec. 28, 2011

(86) PCT No.: PCT/US2011/067497
§ 371 (c)(1),
(2), (4) Date: Jun. 14, 2013

(87) PCT Pub. No.: WO2013/100940
PCT Pub. Date: Jul. 4, 2013

(65) Prior Publication Data
US 2013/0318292 A1    Nov. 28, 2013

(51) Int. Cl.
| G06F 13/00 | (2006.01) |
| G06F 12/0891 | (2016.01) |
| G11C 7/10 | (2006.01) |
| G06F 1/32 | (2006.01) |
| G06F 12/0895 | (2016.01) |

(52) U.S. Cl.
CPC ........ G06F 12/0891 (2013.01); G06F 1/3206 (2013.01); G06F 1/3225 (2013.01); G06F 1/3275 (2013.01); G06F 12/0895 (2013.01); G11C 7/1072 (2013.01); *Y02B 60/1228* (2013.01); *Y02B 60/32* (2013.01)

(58) Field of Classification Search
CPC ................................. G06F 12/00; G06F 12/08
See application file for complete search history.

(56) References Cited

U.S. PATENT DOCUMENTS

| 5,761,715 A * | 6/1998 | Takahashi ............. G06F 1/3215 365/227 |
| 7,934,054 B1 * | 4/2011 | Moll ..................... G06F 1/3203 345/541 |
| 8,103,830 B2 | 1/2012 | Wilkerson et al. |
| 8,667,259 B2 | 3/2014 | Hino et al. |
| 2005/0071564 A1 * | 3/2005 | Luick .................. G06F 12/0806 711/121 |
| 2007/0043965 A1 * | 2/2007 | Mandelblat et al. ......... 713/324 |
| 2007/0156992 A1 * | 7/2007 | Jahagirdar .......... G06F 12/0804 711/167 |
| 2008/0215865 A1 | 9/2008 | Hino et al. |

(Continued)

OTHER PUBLICATIONS

PCT International Search Report for PCT Counterpart Application No. PCT/US2011/067497, 3 pgs., (Jul. 31, 2012).

(Continued)

*Primary Examiner* — Charles Rones
*Assistant Examiner* — Han Doan
(74) *Attorney, Agent, or Firm* — Nicholson De Vos Webster & Elliott, LLP

(57) ABSTRACT

An apparatus is described. The apparatus includes a cache memory having two or more memory blocks and a central processing unit (CPU), coupled to the cache memory, to open a first memory block within the cache memory upon exiting from a low power state.

26 Claims, 5 Drawing Sheets

(56) References Cited

U.S. PATENT DOCUMENTS

| | | | |
|---|---|---|---|
| 2009/0113162 A1* | 4/2009 | Di-Zenzo | G06F 1/3225 711/171 |
| 2010/0082905 A1* | 4/2010 | Wilkerson | G06F 1/3203 711/122 |
| 2010/0332877 A1 | 12/2010 | Yarch et al. | |
| 2011/0010503 A1* | 1/2011 | Yamamura | G06F 12/121 711/128 |
| 2011/0093654 A1* | 4/2011 | Roberts | G06F 1/3203 711/105 |

OTHER PUBLICATIONS

PCT Written Opinion of the International Searching Authority for PCT Counterpart Application No. PCT/US2011/067497, 3 pgs., (dated Jul. 31, 2012).

PCT Notification concerning Transmittal of International Preliminary Report on Patentability (Chapter I of the Patent Cooperation Treaty) for PCT Counterpart Application No. PCT/US2011/067497, 5 pgs., (dated Jul. 10, 2014).

* cited by examiner

CACHE MEMORY STAGED REOPEN

CROSS-REFERENCE TO RELATED APPLICATION

This patent application is a U.S. National Phase Application under 35 U.S.C. §371 of International Application No. PCT/US2011/067497, filed Dec. 28, 2011, entitled CACHE MEMORY STAGED REOPEN.

FIELD OF THE INVENTION

This disclosure relates to cache memories in particular to cache memory power states.

BACKGROUND

Power management is an important feature in computer design. Power consumption and related cooling costs are a significant portion of the operation of computer systems. Thus, since units operating at high clock frequencies in a computer system (e.g., central processing units (CPUs), main memories (e.g., random access memories (RAMs)) and chipsets) typically consume more power than other units, these components typically enter a low power state (e.g., power shut down) when not in use and exit the power state once operation is to resume.

However whenever a CPU transitions from an active power state to the lower power state, a flushing of the processor cache memories is necessary. The time to flush the cache memory is typically proportional to its size. Thus, a larger cache takes more time to flush than a smaller cache. A flushing operation is a processor expensive operation, which requires a Modified-Exclusive-Shared-Invalid (MESI) state of each line of cache to be read and flushed if necessary. During the flushing operation the CPU core remains in active state, without having an ability to perform useful operations besides the flush. As a result, the cache flush is slows the CPU's entry into the low power mode.

BRIEF DESCRIPTION OF THE DRAWINGS

A better understanding of the present invention can be obtained from the following detailed description in conjunction with the following drawings, in which.

DETAILED DESCRIPTION

A cache memory staged reopen is described. In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
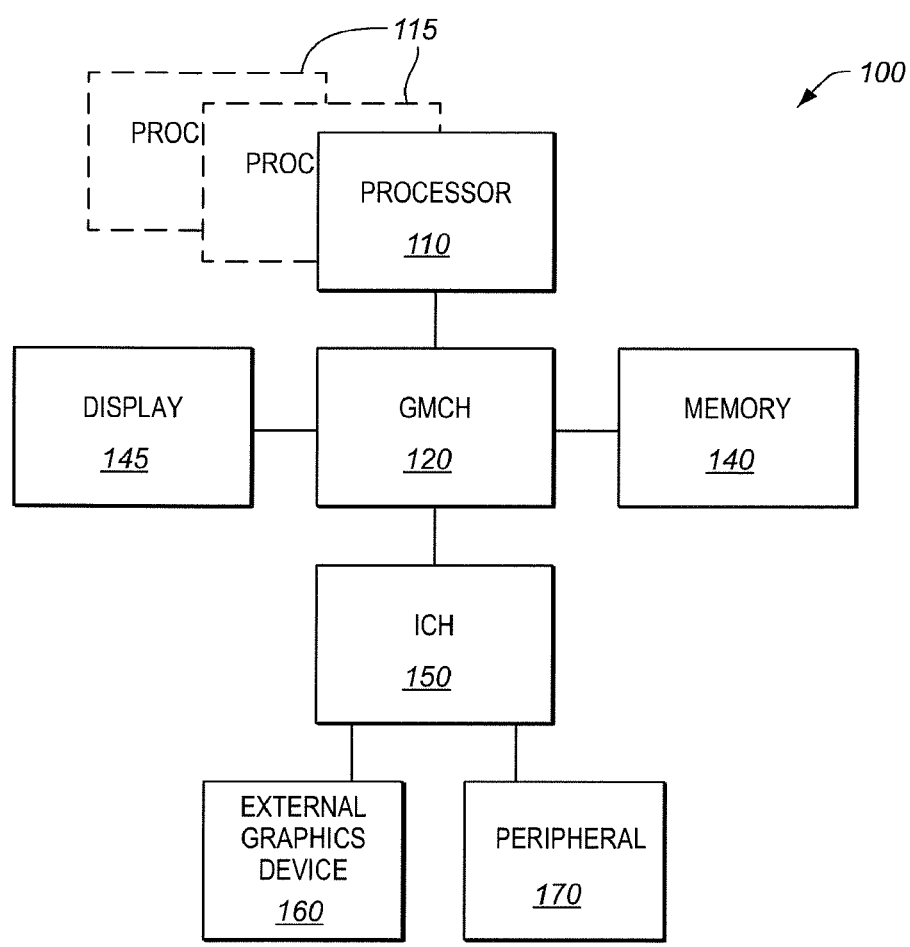
FIG. 1 is a block diagram illustrating one embodiment of a system.

Referring now to FIG. 1, shown is a block diagram of a system 800 in accordance with one embodiment of the invention. The system 100 may include one or more processors 110, to 115, which are coupled to memory controller hub (MCH) 120. The optional nature of additional processors 115 is denoted in FIG. 1 with broken lines.

FIG. 1 illustrates that the MCH 120 may be coupled to a memory 140 that may be, for example, a dynamic random access memory (DRAM). The DRAM may, for at least one embodiment, be associated with a non-volatile cache.

The MCH 120 may be a chipset, or a portion of a chipset. The MCH 120 may communicate with the processor(s) 110, 115 and control interaction between the processor(s) 110, 115 and memory 140. The MCH 120 may also act as an accelerated bus interface between the processor(s) 110, 115 and other elements of the system 100. For at least one embodiment, the MCH 120 communicates with the processor(s) 110, 115 via a multi-drop bus, such as a frontside bus (FSB) 195.

Furthermore, MCH 120 is coupled to a display 145 (such as a flat panel display). In one embodiment, MCH 120 may include an integrated graphics accelerator. MCH 120 is further coupled to an input/output (I/O) controller hub (ICH) 150, which may be used to couple various peripheral devices to system 100. Shown for example in the embodiment of FIG. 1 is an external graphics device 160, which may be a discrete graphics device coupled to ICH 150, along with another peripheral device 170.

Alternatively, additional or different processors may also be present in the system 100. For example, additional processor(s) 115 may include additional processors(s) that are the same as processor 110, additional processor(s) that are heterogeneous or asymmetric to processor 110, accelerators (such as, e.g., graphics accelerators or digital signal processing (DSP) units), field programmable gate arrays, or any other processor. There can be a variety of differences between the physical resources 110, 115 in terms of a spectrum of metrics of merit including architectural, microarchitectural, thermal, power consumption characteristics, and the like. These differences may effectively manifest themselves as asymmetry and heterogeneity amongst the processing elements 110, 115. For at least one embodiment, the various processing elements 110, 115 may reside in the same die package.

Processor 110 includes a cache memory 106 to store data for CPU 110. In one embodiment, processors 115 also include cache memories 106. In such an embodiment, cache memories 106 are coherent memories that are shared with other agents (e.g., processor 110 and 115, graphics device 160, etc.). As discussed above, cache memory 106 must be flushed whenever processor 110 transitions from an active power state to the lower power, which slows the processor 110 entry into the low power mode.

Figure 2:
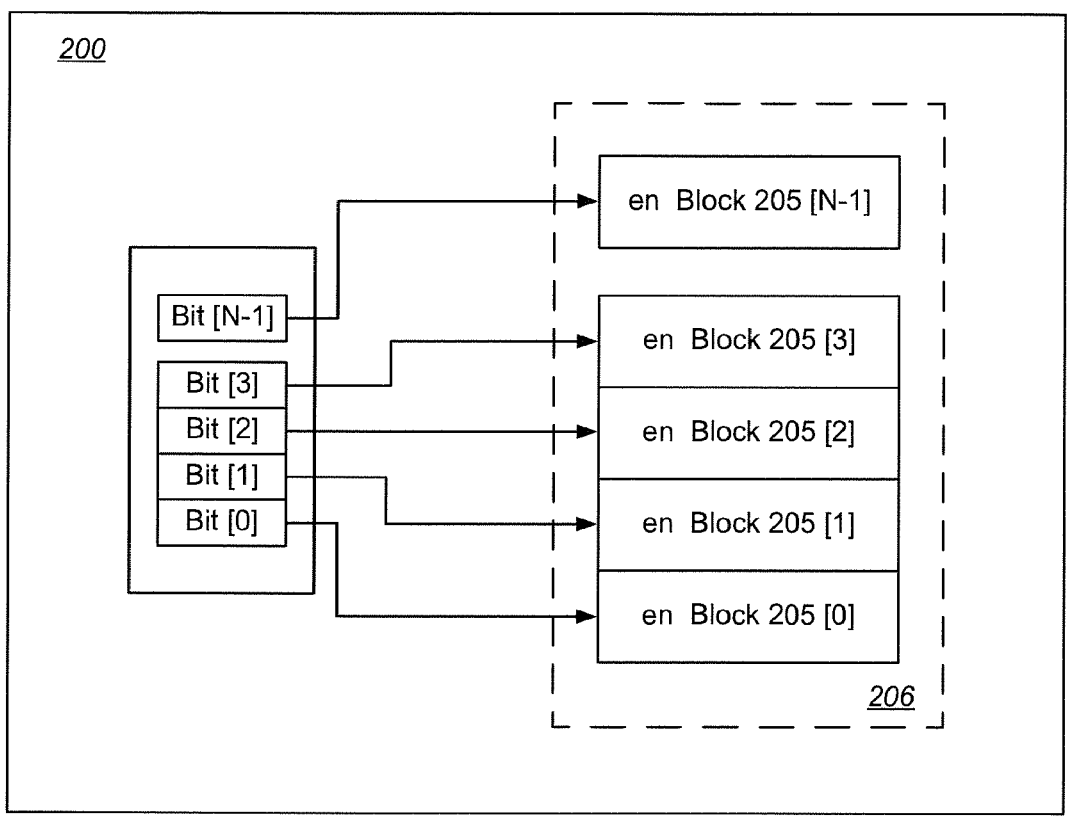
FIG. 2 is a block diagram illustrating one embodiment of a processor.

According to one embodiment, cache 106 includes a plurality of small blocks that are opened in stages upon exit from a low power state. FIG. 2 illustrates one embodiment of a processor 200 including cache memory 206. Cache memory 206 includes memory blocks 205 (e.g., 205(0)-205(N−1)). Memory blocks 205 comprise incremental components of cache memory 206. For instance, eight 1 MB memory blocks 205 may be included for an 8 MB cache memory 206 embodiment.

In one embodiment, a single block (e.g., block 205(0)) is opened when cache memory 206 exits a low power state. In such an embodiment, processor 210 tracks the misses from cache memory 206 once operating in the active power state and determines whether those misses are compulsory (e.g., due to the first access to the memory) or capacity (due to insufficient cache memory 206 capacity) misses. In one embodiment, a counter is implemented to track the number of capacity misses that occur.

According to one embodiment, processor 210 opens an additional block of cache memory 206 once the number of capacity misses exceeds a predetermined counter threshold in order to eliminate the performance hit of using less than full capacity of cache memory 206. For instance, if cache memory 206 is operating solely with block 205(0), block 205(1) is opened upon processor 206 detecting that the number of capacity misses has exceeded the predetermined threshold. Similarly, block 205(2) is opened when the threshold of capacity misses has been exceeded for operation with blocks 205(0) and block 205(1) opened, and so on.

In one embodiment, microcode executed at processor 206 is implemented to flush cache memory 206 upon entrance into the low power state. Since in many instances only a subset of blocks 205 will be opened whenever processor 206 is to enter the low power state, processor 206 is required to flush only those open blocks. Thus, the time to enter the low power state is shortened.

Processor 200 also includes a control register 220 (e.g., CACHE_OPEN_BLOCKS) having one bit corresponding each memory block 205 in cache memory 206. Thus, control register 220 includes bits 0-N-1, corresponding to 205(0)-205(N-1). In one embodiment, a bit is enabled if the corresponding memory block 205 is opened. Thus if all the bits are set, all of cache memory 206 is open. In a further embodiment, a block 205 is closed once the corresponding bit is reset.

Figure 3:
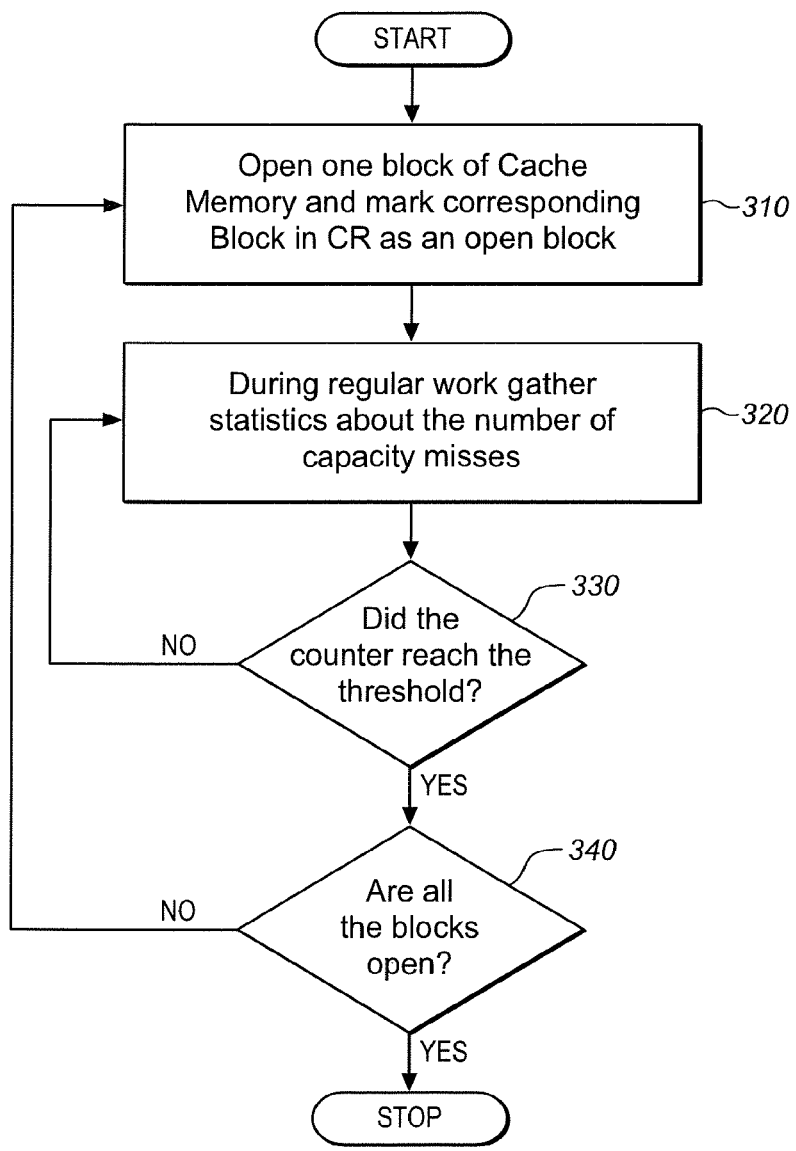
FIG. 3 is a flow diagram illustrating one embodiment of a cache exiting a low power mode.

FIG. 3 is a flow diagram illustrating one embodiment of cache memory 206 exiting the low power mode and entering an active mode. At processing block 310, a block 205 (e.g., 205(0) is opened within cache memory 206, and the corresponding bit in control register 220 is set. At processing block 320, statistics regarding the number of capacity miss occurrences is tracked.

At decision block 330, it is determined whether the counter has reached a predetermined threshold. If the counter has not reached the predetermined threshold, control is returned to processing block 320 where the statistics continue to be tracked. However, if the counter has reached the predetermined threshold, it is determined whether all of the blocks 205 are open, decision block 340. If not, control is returned to processing block 310 where another block 205 is opened and corresponding set. Otherwise, the process is completed if all blocks 205 are already open.

Figure 4:
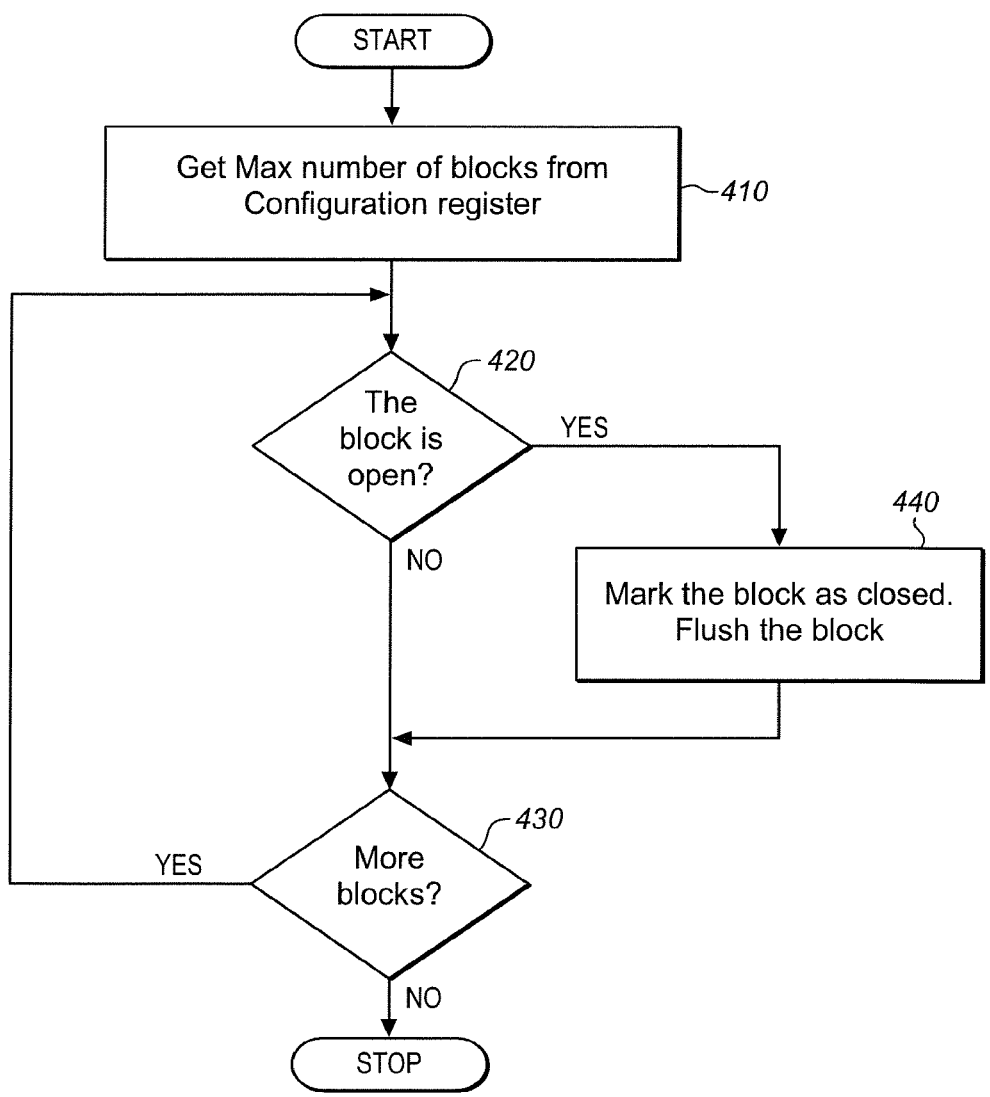
FIG. 4 is a flow diagram illustrating one embodiment of a cache entering a low power mode.

FIG. 4 is a flow diagram illustrating one embodiment of a cache entering a low power mode. At processing block 410, the number of blocks 205 within cache memory 206 is retrieved from configuration register 220. At decision block 420, it is determined whether a first block 250 (e.g., block 250(0)) is open. If the block 250 is open, a determination is made as to whether there are additional blocks to process, decision block 430. If open, the block 250 is flushed and the corresponding bit is reset to mark the block as closed, processing block 430 before proceeding to decision block 430. If there are additional blocks to process, control is returned to decision block 420 where it is determined whether the next block 250 is open.

Figure 5:
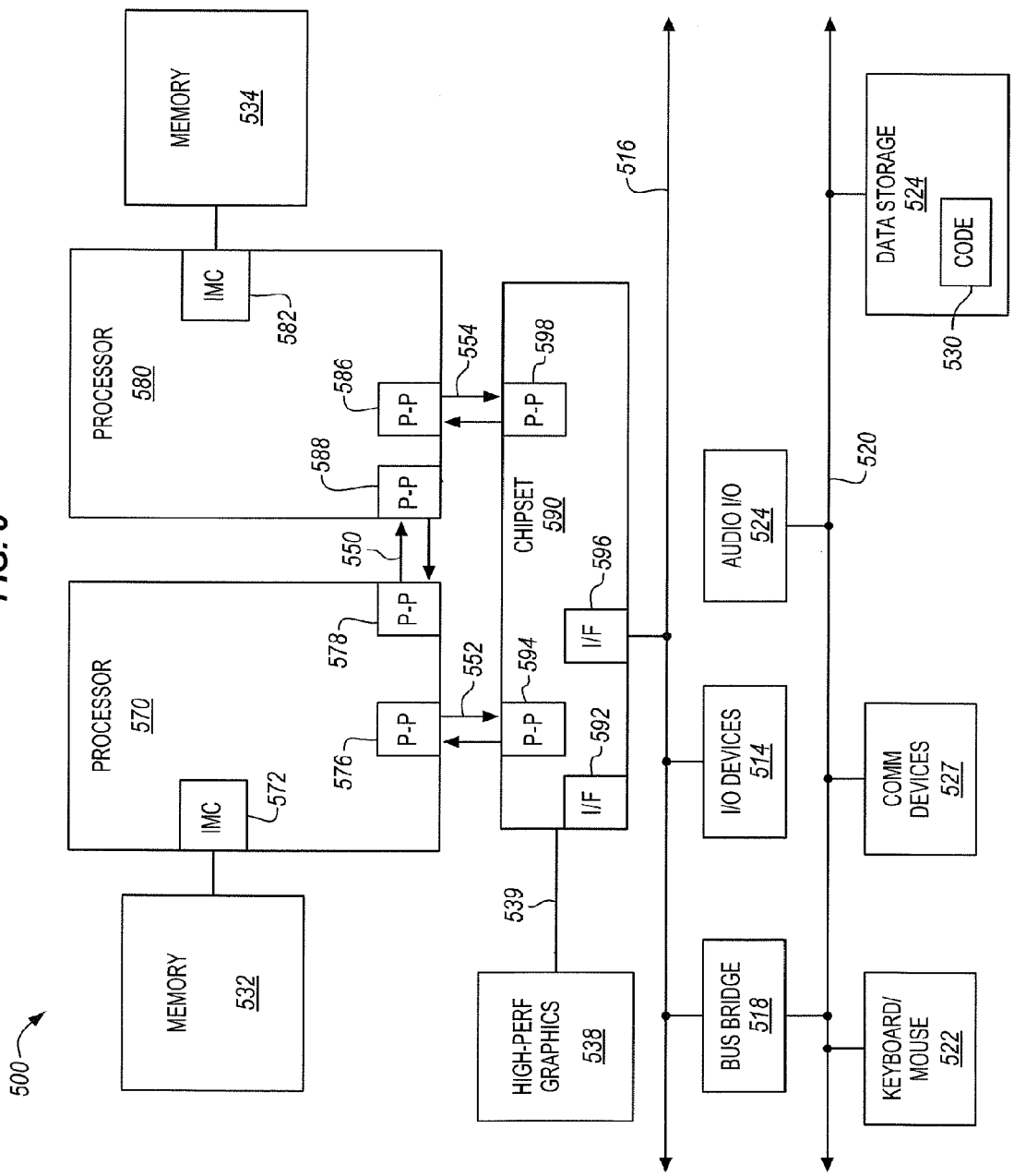
FIG. 5 is a block diagram illustrating another embodiment of a system.

Referring now to FIG. 5, shown is a block diagram of a second system 500 in accordance with an embodiment of the present invention. As shown in FIG. 5, multiprocessor system 500 is a point-to-point interconnect system, and includes a first processor 570 and a second processor 580 coupled via a point-to-point interconnect 550. As shown in FIG. 5, each of processors 570 and 580 may be some version of the processors 110 and 115.

Alternatively, one or more of processors 570, 580 may be an element other than a processor, such as an accelerator or a field programmable gate array. While shown with only two processors 570, 580, it is to be understood that the scope of the present invention is not so limited. In other embodiments, one or more additional processing elements may be present in a given processor.

Processor 570 may further include an integrated memory controller hub (IMC) 572 and point-to-point (P-P) interfaces 576 and 578. Similarly, second processor 580 may include a IMC 582 and P-P interfaces 586 and 588. Processors 570, 580 may exchange data via a point-to-point (PtP) interface 550 using PtP interface circuits 578, 588. As shown in FIG. 5, IMC's 572 and 582 couple the processors to respective memories, namely a memory 542 and a memory 544, which may be portions of main memory locally attached to the respective processors.

Processors 570, 580 may each exchange data with a chipset 590 via individual P-P interfaces 552, 554 using point to point interface circuits 576, 594, 586, 598. Chipset 590 may also exchange data with a high-performance graphics circuit 538 via a high-performance graphics interface 539.

A shared cache (not shown) may be included in either processor outside of both processors, yet connected with the processors via P-P interconnect, such that either or both processors' local cache information may be stored in the shared cache if a processor is placed into a low power mode. Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present invention is not so limited.

As shown in FIG. 5, various I/O devices 514 may be coupled to first bus 516, along with a bus bridge 518 which couples first bus 516 to a second bus 520. In one embodiment, second bus 520 may be a low pin count (LPC) bus. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520. Note that other architectures are possible. For example, instead of the point-to-point architecture of FIG. 5, a system may implement a multi-drop bus or other such architecture.

In other embodiments, different system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

The above description is intended to illustrate embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents. For example, one or more operations of a method may be combined or further broken apart.

While embodiments have been described above, alternative embodiments of the invention may be implemented. Also, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate embodiments of the invention. The scope of the invention is not to be determined by the specific examples provided above but only by the claims below.

What is claimed is:

1. An apparatus comprising:
   a cache memory having two or more memory blocks;
   a central processing unit (CPU) incorporating the cache memory, the CPU to:
      open at most a single memory block within the cache memory upon exiting from a low power state;
      open subsequent blocks in stages after entering an active state from existing the lower power state, one at a time; and
      flush and close every memory block that is open immediately before entering the low power state, wherein the CPU includes a control register having multiple bits, each single bit per memory block indicates a corresponding memory block open status, the CPU to reference the control register so that only open memory blocks are flushed, and wherein no memory block is to be open during the low power state;
      wherein each of the single bits indicating the open status of the corresponding memory block is reset whenever the corresponding memory block is closed; and
   a memory external to the CPU, the CPU further to:
      store a state in the memory for each memory block before flushing and closing the memory block, and to restore the state from the memory for each memory block upon exiting the low power state.

2. The apparatus of claim 1 wherein the CPU is to track misses from the cache memory to determine whether the misses are compulsory or capacity misses.

3. The apparatus of claim 2 wherein the CPU is to open a second memory block within the cache memory upon determining that a number of capacity misses has exceeded a predetermined threshold.

4. The apparatus of claim 3 wherein the CPU is to open a third memory block within the cache memory upon determining that a number of capacity misses has exceeded the predetermined threshold.

5. The apparatus of claim 1, further comprising:
   a second cache memory having two or more memory blocks;
   a second CPU coupled to the second cache memory; and
   an interconnect to couple the CPU and the second CPU to each other and to the memory;
   wherein a memory space within the memory is shared by the CPU and the second CPU.

6. The apparatus of claim 5, wherein the second CPU is to:
   open at most a single memory block within the second cache memory upon exiting from a low power state, wherein no memory block is to be open during the low power state; and
   flush and close each of the two or more memory blocks of the second cache memory that is open upon entering the low power state, wherein the second CPU includes a control register having multiple bits, each single bit per memory block to indicate a corresponding memory block of the second cache memory is open and only open memory blocks are to be flushed;
   wherein the CPU is further to: store a state in the memory for each memory block of the second cache memory before flushing and closing the memory block, and restore the state from the memory for each memory block of the second cache memory upon exiting the low power state.

7. The apparatus of claim 6 wherein the second CPU is to track misses from the second cache memory to determine whether the misses are compulsory or capacity misses.

8. The apparatus of claim 7 wherein the second CPU is to open a second memory block within the second cache memory upon determining that a number of capacity misses has exceeded a third predetermined threshold.

9. The apparatus of claim 8 wherein the second CPU to open a third memory block within the second cache memory upon determining that the number of capacity misses has exceeded a fourth predetermined threshold.

10. The apparatus of claim 9, wherein the second CPU comprises a graphics processing unit (GPU).

11. The apparatus of claim 9, wherein the second CPU comprises a digital signal processor (DSP).

12. A method comprising:
   opening at most a single memory block of a plurality of memory blocks within a cache memory upon exiting a low power mode to enter an active mode, the cache memory being incorporated in a processor, wherein no memory block is to be open during the low power mode;
   operating the processor with the cache having at most one open block while in the active mode for a plurality of cycles and counting a number of capacity miss occurrences;
   opening a second memory block of the plurality of memory blocks when the number of capacity miss occurrences has reached a predetermined threshold; and
   enabling a first bit in a multi-bit control register corresponding to the first memory block upon opening the first memory block of the plurality of the memory blocks and enabling a second bit in the multi-bit control register corresponding to the second of the plurality of the memory blocks upon opening the second of the plurality of memory blocks;
resetting each of the first bit and the second bit in the multi-bit control register whenever the corresponding memory block is closed.

13. The method of claim 12 further comprising tracking the number of capacity miss occurrences after opening the single memory block.

14. The method of claim 12 further comprising determining when the number of capacity miss occurrences has reached a second predetermined threshold after opening the second memory block of the plurality of memory blocks.

15. The method of claim 14 further comprising opening a third memory block of the plurality of memory blocks when the number of capacity miss occurrences has reached the second predetermined threshold.

16. The method of claim 15 further comprising determining whether all of the memory blocks within the cache memory have been opened prior to opening the third memory block.

17. A method comprising:
immediately prior to entering a low power mode:
determining whether a first of a plurality of memory blocks within a cache memory is open;
flushing and closing the first memory block when the first memory block is open;
determining whether a second of the plurality of memory blocks within the cache memory is open;
flushing and closing the second memory block when the second memory block is open;
determining whether any additional memory blocks within the cache are open; and
flushing and closing each of the any additional memory blocks that is open;
wherein no memory block is to be open during the low power mode;
resetting each single bit of a multi-bit control register, each single bit that indicates the open status of a corresponding memory block is reset whenever the corresponding memory block is closed.

18. The method of claim 17 further comprising not flushing or closing the second memory block when the second memory block is not open.

19. The method of claim 17 further comprising marking the first memory block as being closed after flushing and closing the first memory block.

20. The method of claim 19 wherein marking the first memory block as being closed comprises resetting a bit in the multi-bit control register, the multi-bit control register comprising at least as many bits as there are memory blocks in the cache, the bit corresponding to the first memory block.

21. The method of claim 17, further comprising retrieving the number of memory blocks within the cache memory prior to determining whether the first memory block is open.

22. The method of claim 21, further comprising determining whether the cache memory includes additional memory blocks prior to determining whether the second memory block is open.

23. A system comprising:
an interconnect;
a processor coupled with the interconnect, including:
a cache memory having two or more memory blocks, wherein the processor is to:
open at most a single memory block within the cache memory upon exiting from a low power state, wherein no memory block is to be open during the low power state; and
flush and close every memory block that is open upon entering the low power state, wherein the processor includes a control register having multiple bits, each single bit per memory block indicates a corresponding memory block open status and only open memory blocks are to be flushed;
reset each single bit in the control register indicating the open status whenever the corresponding memory block is closed; and
a dynamic random access memory (DRAM) coupled with the interconnect.

24. The system of claim 23 wherein the processor is to track misses from the cache memory to determine whether the misses are compulsory or capacity misses.

25. The system of claim 24 wherein the processor is to open a second memory block within the cache memory upon determining that a number of capacity misses has exceeded a predetermined threshold.

26. The system of claim 25 wherein the processor is to open a third memory block within the cache memory upon determining that the number of capacity misses has exceeded a second predetermined threshold.

* * * * *